United States Patent [19]

Ota et al.

[11] 3,917,991

[45] Nov. 4, 1975

[54] DIFFERENTIAL CIRCUIT WITH IMPROVED SIGNAL BALANCE

[75] Inventors: Yoshio Ota, Fujisawa; Masashi Takeda, Isehara, both of Japan

[73] Assignee: Sony Corporation, Tokyo, Japan

[22] Filed: Aug. 8, 1974

[21] Appl. No.: 495,930

[30] Foreign Application Priority Data

Aug. 10, 1973 Japan .............................. 48-90216

[52] U.S. Cl. .................. 321/8 R; 307/260; 328/26; 330/30 D

[51] Int. Cl.$^2$ .......................................... H02M 7/00

[58] Field of Search .............. 321/8 R, 47; 324/119; 330/30 D, 98, 100; 328/26; 307/260

[56] References Cited

UNITED STATES PATENTS

| | | | |
|---|---|---|---|
| 3,144,564 | 8/1964 | Sikorra | 330/30 D |
| 3,419,787 | 12/1968 | Baehre | 321/47 |
| 3,772,582 | 11/1973 | Martin | 321/47 |

FOREIGN PATENTS OR APPLICATIONS

| | | | |
|---|---|---|---|
| 29,246 | 9/1970 | Japan | 330/30 D |

OTHER PUBLICATIONS

Electronic Engineering, "Simple Temperature Compensated D.C. Amplifier," p. 537, Aug. 1966.

Electronic Engineering, "Some Precision Direct Coupled Transistor Amplifiers---," pp. 454–457, July 1964.

IBM Technical Disclosure Bulletin, "Active Load for Differential Amplifiers," Vol. 16, No. 10, p. 3140–3141, Mar. 1974.

*Primary Examiner*—Gerald Goldberg
*Attorney, Agent, or Firm*—Lewis H. Eslinger, Esq.; Alvin Sinderbrand, Esq.

[57] ABSTRACT

A differential circuit having a first pair of transistors connected in a differential amplifier to amplify an applied signal. Input terminals of a second differential amplifier are connected to output terminals of the first amplifier and a feedback circuit is connected from an output terminal of the second differential amplifier to an input circuit of the first differential amplifier to supply thereto an output signal of the second amplifier in inverse polarity to the signal applied to the first amplifier. This improves the balance of the output signal of the second differential amplifier relative to the zero level, and this output signal may be rectified by a full-wave rectifier to have equal excursions from the zero axis for each successive half cycle of a sinusoidal signal.

12 Claims, 3 Drawing Figures

DIFFERENTIAL CIRCUIT WITH IMPROVED SIGNAL BALANCE

BACKGROUND OF THE INVENTION

1. Field of the Invention

This invention relates to the field of differentially-connected transistor circuits and particularly to means for improving the balance of the output signal of such amplifiers relative to a zero level. The circuit is especially adapted to provide balanced, full-wave rectified signals, even for input signals of low amplitude.

2. The Prior Art

In conventional full-wave rectifying circuits, a phase splitter, or phase inverter, is provided to transform a single-ended signal to a pair of signals of mutually opposite polarity. The phase splitter may be a transformer with a two terminal input winding and a center tapped output winding. The signals at opposite ends of the output winding may be rectified to produce a full-wave rectified signal that is then smoothed by a filter circuit. However, in the case of input signals of small amplitude, the rectified output signal is likely to include non-linear distortion because of the non-linear characteristic of the diode elements. This causes the ripple content of the output signal to be increased. In addition, if the magnitude of the input signal is below the forward direction voltage of the diode, the rectifying circuit cannot rectify the input signal at all.

Such circuits are also dependent upon the forward direction voltage and temperature characteristics of the diodes used for rectification. It is desirable that the diodes be identical with each other and that the circuit be perfectly balanced or else the successive half cycles of the rectified signal, in the case of a sinusoidal input signal, will be of different amplitude and will result in an increase in the ripple content of the output signal.

SUMMARY OF THE INVENTION

It is one object of the present invention to provide an improved balanced transistor circuit using differential amplifiers.

A further object is to provide an improved transistor rectifying circuit for obtaining full-wave rectification of a properly balanced signal.

A further object of the invention is to provide improved stability of rectifying operation of a transistor circuit with respect to temperature variations of the circuit components.

A still further object of the invention is to provide a circuit that symetrically rectifies an applied signal to obtain successive rectified half cycles of equal amplitude regardless of the threshold voltage and temperature characteristic of the rectifying elements.

A still further object of the present invention is to provide an improved balanced transistor circuit especially adapted for construction as part of an integrated circuit.

DESCRIPTION OF THE PREFERRED EMBODIMENT

Figure 1:
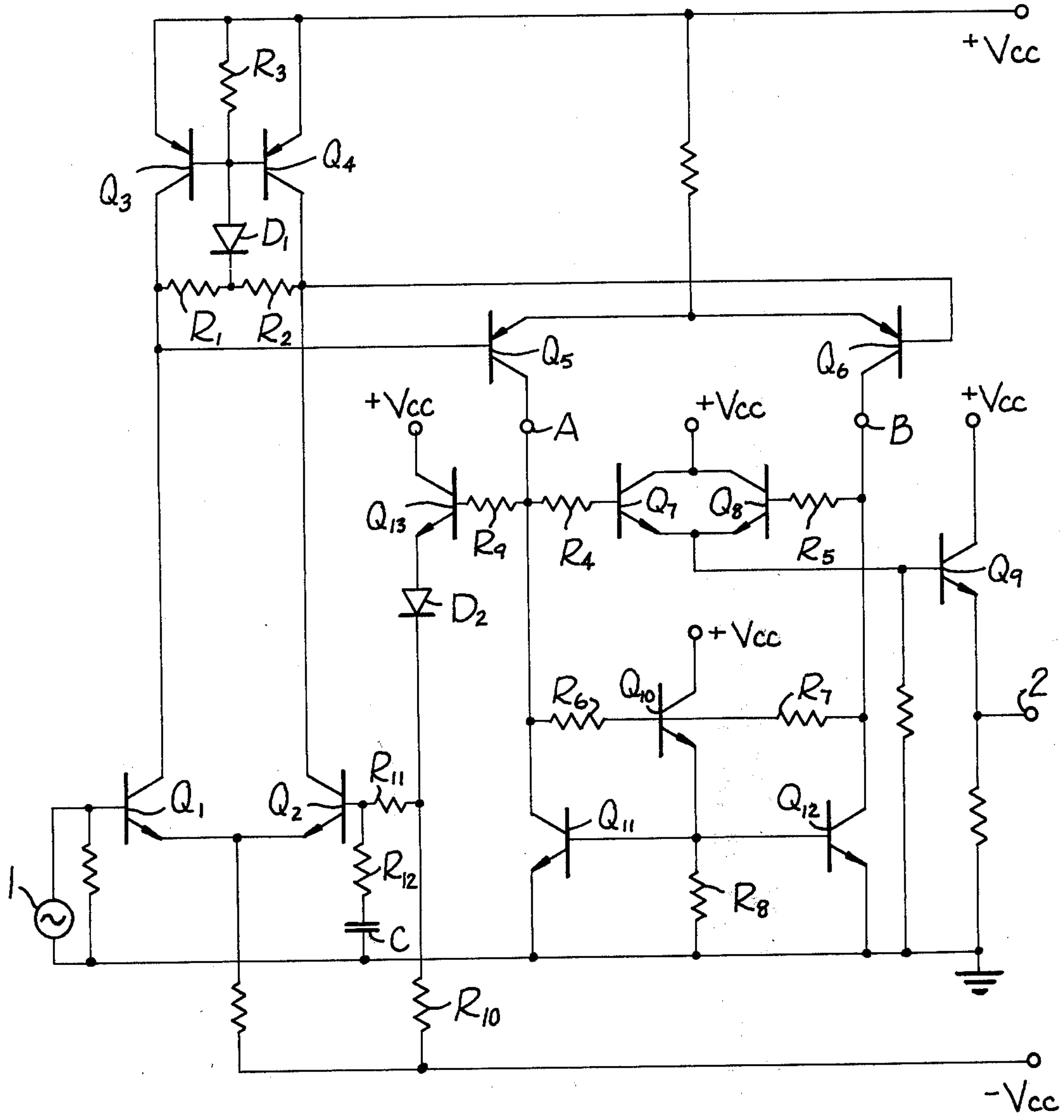
FIG. 1 is a schematic diagram of a rectifying circuit constructed according to the invention.

In the circuit in FIG. 1 an alternating voltage signal source 1 is connected between a common terminal, such as ground, and the base of a transistor $Q_1$ that, together with a transistor $Q_2$, forms an input differential amplifier. The two transistors $Q_1$ and $Q_2$ are NPN transistors that have their emitters connected by a common emitter resistor to a negative terminal $-V_{cc}$, and their collectors connected, respectively, to the collectors of another pair of transistors $Q_3$ and $Q_4$. The latter are PNP transistors that have their emitters connected together directly to a positive voltage terminal $+V_{cc}$. Two resistors $R_1$ and $R_2$ are connected between the collectors of the transistors $Q_1$ and $Q_2$ and the cathode of a diode $D_1$. The anode of this diode is connected to the bases of the transistors $Q_3$ and $Q_4$, and a resistor $R_3$ is connected between these bases and the emitters of the transistors $Q_3$ and $Q_4$.

The collectors of the transistors $Q_1$ and $Q_2$ comprise output terminals for the first differential amplifier and are connected to base input terminals of two transistors $Q_5$ and $Q_6$ of a second differential amplifier. These are also PNP transistors and have their emitters connected to the power supply terminal $+V_{cc}$ through a common emitter resistor. The collectors of the transistors $Q_5$ and $Q_6$ are connected through respective resistors $R_4$ and $R_5$ to the bases of a pair of rectifying transistors $Q_7$ and $Q_8$. The latter are NPN transistors and have their collectors connected directly together to the power supply terminal $+V_{cc}$ and their emitters connected directly together to the base of an NPN output transistor $Q_9$ connected as an emitter follower and having an output terminal 2 connected to its emitter.

The collectors of the transistors $Q_5$ and $Q_6$ are also connected through a pair of resistors $R_6$ and $R_7$ to the base of an NPN transistor $Q_{10}$. The collector of the transistor $Q_{10}$ is connected to the positive terminal $+V_{cc}$ and its emitter is connected directly to the bases of a pair of NPN transistors $Q_{11}$ and $Q_{12}$. The collectors of the latter transistors are connected directly to the collectors of the transistors $Q_5$ and $Q_6$, respectively, and their emitters are connected directly to ground. The emitter of the transistor $Q_{10}$ and the bases of the transistors $Q_{11}$ and $Q_{12}$ are also connected to ground through a resistor $R_8$.

A feedback section of the circuit includes a resistor $R_9$ connected between the collector of the transistor $Q_5$ and the base of an NPN transistor $Q_{13}$. The collector of the transistor $Q_{13}$ is connected directly to the positive supply terminal $+V_{cc}$, and the transistor $Q_{13}$ is connected as an emitter follower having a diode $D_2$ conductively connected in series with an emitter-load resistor $R_{10}$ between the emitter of the transistor $Q_{13}$ and the negative power supply terminal $-V_{cc}$. A resistor $R_{11}$ connects the common circuit point between the diode $D_2$ and the resistor $R_{10}$ to the base of the transistor $Q_2$. An RC circuit comprising a resistor $R_{12}$ and a capacitor C connected in series therewith is connected between the base of the transistor $Q_2$ and ground.

The DC biasing condition of the collectors of the transistors $Q_1$ and $Q_2$ in the first differential amplifier is determined by the collector-emitter voltages of the transistors $Q_3$ and $Q_4$, and an equivalent alternating impedance to the collectors of the transistors $Q_1$ and $Q_2$ is determined only by the load resistors $R_1$ and $R_2$, because the collector-emitter impedances of the transistors $Q_3$ and $Q_4$ are, effectively, much larger than the impedances of the resistors $R_1$ and $R_2$. Therefore, it is possible to use high resistance values for the load resistors $R_1$ and $R_2$ without considering the DC biasing condition of the first differential amplifier. In this way, the gain of the first differential amplifier can be made high.

The collectors of the transistors $Q_1$ and $Q_2$ could, alternatively, simply be connected by load resistors to the voltage terminal $+V_{cc}$ in the manner of a standard differential amplifier. However, since the resistance of the load resistors is preferably large, the dynamic range of such an amplifier would be narrow due to the direct voltage drop across large load resistors.

The circuit of the second differential amplifier comprising the transistors $Q_5$ and $Q_6$ is basically similar to that of the first differential amplifier comprising the transistors $Q_1$ and $Q_2$. The load circuit of the transistors $Q_5$ and $Q_6$ includes the resistors $R_6$–$R_8$ and the transistors $Q_{10}$–$Q_{12}$. The transistor $Q_{10}$ is basically similar to the rectifier $D_1$ in that it is a uni-directionally conductive device.

Figure 2:
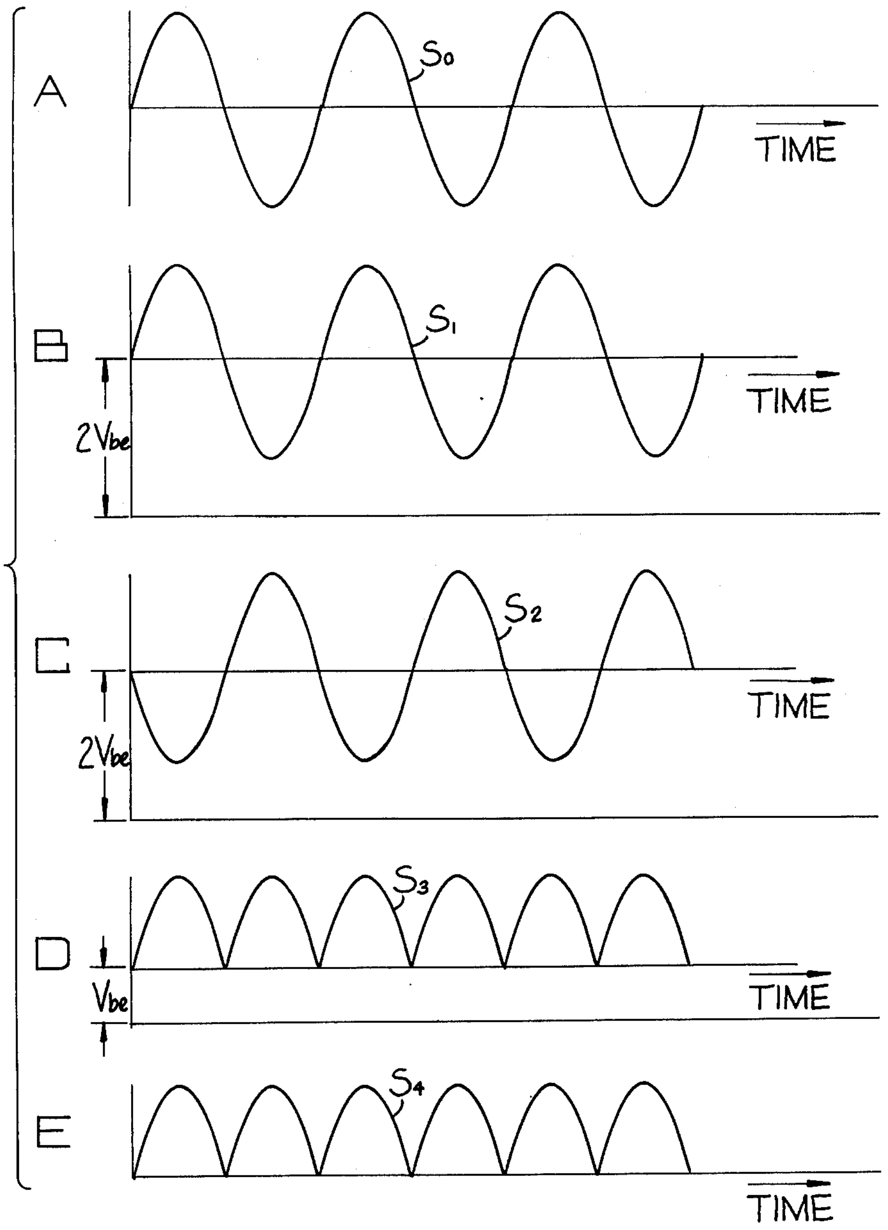
FIGS. 2A–2E are signal waveforms obtained in the operation of the circuit in FIG. 1.

In the operation of the circuit in FIG. 1, reference will be made to the voltage waveforms shown in FIGS. 2A–2E. If it is assumed that an input voltage $S_0$ from the input signal source 1 is applied between the base of the transistor $Q_1$ of the first differential amplifier and ground, the first differential amplifier will produce two output signals of opposite polarity at the collectors of the transistors $Q_1$ and $Q_2$, and these output signals of the first differential amplifier will be connected to the base input terminals of the second differential amplifier comprising the transistors $Q_5$ and $Q_6$. The resulting signal voltages at the collectors of the transistors $Q_5$ and $Q_6$ are shown in FIGS. 2B and 2C in which the signal $S_1$ is the output signal at the collector of the transistor $Q_5$ at the point A and the signal $S_2$ is the signal at the collector of the transistor $Q_6$ at the point B.

The signals $S_1$ and $S_2$ have their axes offset from zero by a direct voltage $2V_{be}$. This direct component is the voltage that would be present at the respective points A and B if there were no alternating voltage applied by the source 1. $2V_{be}$ is the sum of the voltage $V_{be}$ between the base and emitter of the transistor $Q_{11}$, which is identical with the voltage between the base and emitter of the transistor $Q_{12}$, and the voltage $V_{be}$ between the base and emitter of the transistor $Q_{10}$.

The positive half cycle of the signal $S_1$ at the point A is rectified by the base-emitter junction of the transistor $Q_7$, and the positive half cycle of the voltages $S_2$ at the point B is rectified by the base-emitter junction of the transistor $Q_8$. Thus, a full-wave rectified signal $S_3$ as shown in FIG. 2D is produced at the emitters of the transistors $Q_7$ and $Q_8$. This signal has a direct voltage offset of $V_{be}$ due to the fact that the offset $2V_{be}$ present at the points A and B is reduced by $V_{be}$ between the base and emitter of either of the transistors $Q_7$ and $Q_8$. When the voltage $S_3$ is applied to the base of the transistor $Q_9$, it produces an output voltage $S_4$ shown in FIG. 2E at the output terminal 2. The offset $V_{be}$ is no longer present because of the voltage drop $V_{be}$ between the base and the emitter of the transistor $Q_9$. Because, the signal to be rectified includes a predetermined offset at the rectifying stage comprising the transistors $Q_7$ and $Q_8$, it is possible to rectify very small input signals with good fidelity and yet to achieve an output signal that has OV offset.

The circuit in FIG. 1 also compensates for variations of the output voltage due to changes in temperature. The variations in the total $V_{be}$ of the transistors $Q_7$ and $Q_8$ and the transistor $Q_9$ are balanced by variations in the total $V_{be}$ of the transistors $Q_{10}$ with the transistors $Q_{11}$ or $Q_{12}$. Thus, when no input signal voltage is applied to the circuit, the output voltage at the terminal 2 will always be kept at OV. However, if the base-emitter voltage $V_{be}$ and the DC current amplification $h_{fe}$ in the transistors $Q_5$ and $Q_6$ of the second differential amplifier or in the transistors $Q_1$ and $Q_2$ of the first differential amplifier are not balanced, that is are not equal to each other, the potentials at the points A and B will be different. As a result, the rectified output voltage obtained at the output terminal will have a different level on alternate half cycles even though the signal being rectified is a sinusoidal wave symetrical about the zero axis. A full-wave rectified voltage with this type of distortion is shown in FIG. 3A.

Figure 3:
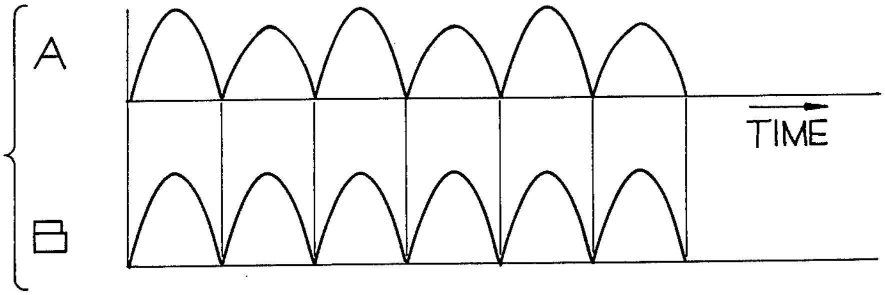
FIGS. 3A and 3B are graphs of rectified signals to illustrate the operation of the circuit in FIG. 1.

The circuit in FIG. 1 provides means for avoiding the type of distortion that produces the signal in FIG. 3A by means of a feedback connection from the second differential amplifier to the first differential amplifier. For example, assuming that the direct voltage at the point A goes up above a predetermined voltage level and that this fluctuation is transferred by the transistor $Q_{13}$ and the diode $D_2$ to the base of the transistor $Q_2$ in the first differential amplifier, the collector current of the transistor $Q_2$ will increase in response to the increase of the potential at its base. On the other hand, by differential operation, the collector current of the transistor $Q_1$ will decrease so that the base potential of the transistor $Q_5$ that obtains its voltage from the transistor $Q_1$ will increase, and the collector current of the transistor $Q_5$ will decrease. As a result, the voltage at the point A will be reduced to its stabilized level.

Similarly, an AC signal is fed back from the second differential amplifier to the first differential amplifier. In this case if the resistance of the $R_{12}$ in the feedback circuit is varied, such variation can be used to adjust the gain of the AC feedback loop. It is also possible to compensate for variations of the base-emitter voltages $2V_{be}$ of the transistors $Q_{10}$ and $Q_{11}$ due to temperature variations. This compensation may be achieved by inserting the base-emitter junction of the transistor $Q_{13}$ and the diode $D_2$ in the feedback loop.

According to the present invention it is also possible to make the potential of the point A equal to the potential of the point B even though the values of $h_{fe}$ and $V_{be}$ in all of the transistors are not equal to each other. FIG. 3B shows a properly rectified output signal at the output terminal 2 in which the compensation referred to hereinabove has been made so that the amplitude of each half cycle will be equal to a fixed value.

This invention has been described in specific terms, and particularly with reference to a full-wave rectifying circuit. However, it should be understood that the circuit is capable of other configurations and may be used, for example, in a complex circuit involving a plurality of differential amplifiers connected in series.

What is claimed is:

1. A transistor circuit comprising:

A. a first differential amplifier comprising a first pair of amplifying transistors and a first pair of output terminals;

B. a second differential amplifier comprising a second pair of amplifying transistors, a pair of input terminals connected to said output terminals of said first differential amplifier, and a pair of output terminals; and C. a signal feedback circuit comprising:

1. a transistor connected as an emitter-follower having an input electrode connected to one of said output terminals of said second differential amplifier and an output electrode, and 2. an output circuit including a diode connected in series between said transistor output electrode and an input terminal of said first differential amplifier to supply a signal received from said transistor output electrode to said first differential amplifier in opposite polarity to the signal amplified thereby.

2. The transistor circuit according to claim 1 in which said feedback circuit further comprises a resistor and capacitor connected in series between said input terminal of said first differential amplifier and a fixed voltage point to control the alternating current feedback signal to said first differential amplifier.

3. The transistor circuit of claim 1 in which at least one of said differential amplifiers comprises a load circuit comprising:

A. first and second load resistors connected in series between a common circuit point and the collectors of said pair of amplifying transistors of said one of said differential amplifiers;

B. first and second biasing transistors of the opposite conductivity type from said last-named amplifying transistors and having the emitter-collector circuits of each of said biasing transistors connected in series with a respective emitter-collector circuit of a corresponding one of said last-named amplifying transistors;

C. uni-directionally conductive means connecting said common circuit point to the bases of both of said biasing transistors; and D. an impedance connecting the bases of both of said biasing transistors to a source of operating potential.

4. The transistor circuit of claim 3 in which said uni-directionally conductive means is a diode.

5. The transistor circuit of claim 3 in which said uni-directionally conductive means comprises the base-emitter circuit of a transistor connected as an emitter-follower.

6. The transistor circuit of claim 1 in which each of said differential amplifiers comprises a load circuit comprising:

A. first and second load resistors connected in series between a common circuit point and the collectors of said pair of amplifying transistors of said one of said differential amplifiers;

B. first and second biasing transistors of the opposite conductivity type from said last-named amplifying transistors and having the emitter-collector circuits of each of said biasing transistors connected in series with a respective emitter-collector circuit of a corresponding one of said last-named amplifying transistors;

C. uni-directionally conductive means connecting said common circuit point to the bases of both of said biasing transistors; and D. an impedance connecting the bases of both of said biasing transistors to a source of operating potential.

7. The transistor circuit of claim 1 in which said transistors of said first pair of amplifying transistors are of one conductivity type and said transistors of said second pair of amplifying transistors are of the opposite conductivity type.

8. A transistor circuit comprising:

a first differential amplifier comprising a first pair of amplifying transistors and a first pair of output terminals;

a second differential amplifier comprising a second pair of amplifying transistors, a pair of input terminals connected to said first differential amplifier output terminals, and a pair of output terminals;

a signal feedback circuit including a transistor having an input electrode connected to one of said second differential amplifier output terminals and an output electrode connected to an output circuit, said output circuit being coupled to a first differential amplifier input terminal to supply a signal thereto in opposite polarity to the signal amplified by said first differential amplifier; and a pair of rectifiers connected to said second pair of amplifying transistors to receive signals therefrom, said rectifiers being connected together to produce a full-wave rectified signal.

9. The transistor circuit according to claim 8 in which each of said rectifiers comprises a rectifying transistor, the collectors of both of said rectifying transistors being connected together to a source of operating voltage and the emitters of both of said rectifying transistors being connected together to an output terminal.

10. A differential circuit with improved signal balance and zero offset output, comprising:

a first differential amplifier including a first pair of amplifying transistors and a first pair of output terminals;

a second differential amplifier including a second pair of amplifying transistors, a pair of input terminals connected to said first differential amplifier output terminals, and a pair of output terminals;

a feedback circuit interconnected between one of said second differential amplifier output terminals and one of said first differential amplifier transistors to supply a signal to said first differential amplifier in opposition to the signal amplified thereby;

first means coupled to said second differential amplifier output terminals for receiving the output signal amplified by said second differential amplifier; said first means having a DC voltage thereacross equal to a semiconductor junction voltage; and second means coupled to said first means for receiving the signal produced by said first means, said second means being coupled to a signal output terminal and having a DC voltage thereacross equal to said semiconductor junction voltage.

11. A differential circuit in accordance with claim 10 wherein each of said first and second means includes a transistor having its base-emitter junction connected in series with said signal output terminal; and wherein said semiconductor junction voltage is the base-emitter voltage.

12. A differential circuit in accordance with claim 11 wherein said first means comprises a pair of rectifying transistors having their base electrodes connected to said second differential amplifier output terminals and their emitter electrodes connected in common; and wherein said second means comprises an emitter-follower.

* * * * *